United States Patent
Kang et al.

(10) Patent No.: US 12,471,404 B2
(45) Date of Patent: Nov. 11, 2025

(54) PHOTOELECTRIC DEVICE BASED ON QUANTUM DOTS AND ITS MANUFACTURING METHOD

(71) Applicant: University-Industry Cooperation Group of Kyung Hee University, Yongin-Si (KR)

(72) Inventors: Seong Jun Kang, Seoul (KR); Jun Hyung Jeong, Suwon-Si (KR)

(73) Assignee: University-Industry Cooperation Group of Kyung Hee University, Yongin-Si (KR)

( * ) Notice: Subject to any disclaimer, the term of this patent is extended or adjusted under 35 U.S.C. 154(b) by 0 days.

(21) Appl. No.: 18/422,955

(22) Filed: Jan. 25, 2024

(65) Prior Publication Data

US 2024/0250193 A1     Jul. 25, 2024

(30) Foreign Application Priority Data

Jan. 25, 2023    (KR) ........................ 10-2023-0009314

(51) Int. Cl.
*H10F 77/14*     (2025.01)
*H10F 30/21*     (2025.01)
*H10F 71/00*     (2025.01)

(52) U.S. Cl.
CPC ....... *H10F 77/1433* (2025.01); *H10F 30/288* (2025.01); *H10F 71/00* (2025.01)

(58) Field of Classification Search
CPC .... H10F 77/1433; H10F 30/288; H10F 71/00; H10F 30/10; H10F 77/30; H10F 30/282; H10F 39/12; H10F 71/1218; H10F 77/12
See application file for complete search history.

(56) References Cited

FOREIGN PATENT DOCUMENTS

KR    20150072888 A    6/2015
KR    20180008099 A    1/2018

OTHER PUBLICATIONS

Kyung-Sang Cho "Color-selective photodetection from intermediate colloidal quantum dots buried in amorphous-oxide semiconductors" Nature Communications | 8: 840 (Year: 2017).*
Abayomi T. Oluwabi "Application of ultrasonic sprayed zirconium oxide dielectric in zinc tin oxide-based thin film transistor" J. Mater. Chem. C, 2020, 8, 3730 (Year: 2020).*
Office Action in corresponding Korean Application No. 10-2023-0009314, dated May 20, 2024 (14 pages).
Jeong, et al. "Highly enhanced visible light photodetection properties of a ZnO phototransistor via an additional solution processed thin Al2O3 layer" Journal of Materials Chemistry C 10.39 (8 pages), dated Sep. 8, 2022.

* cited by examiner

*Primary Examiner* — Michael Y Sun
(74) *Attorney, Agent, or Firm* — Osha Bergman Watanabe & Burton LLP

(57) ABSTRACT

The present disclosure relates to a photoelectric device based on quantum dots with a zirconium oxide layer and its manufacturing method. A photoelectric device according to the present disclosure includes a substrate; a zinc oxide layer stacked on the substrate; a quantum dots (QDs) layer stacked on the zinc oxide layer; and a zirconium oxide layer stacked on the QDs layer. According to the present disclosure, the zirconium oxide layer further formed in the photoelectric device may enable the photoelectric device to operate as a color selective image sensor that selectively detect light in multiple wavelength regions using only quantum dots of a single wavelength.

6 Claims, 9 Drawing Sheets

PHOTOELECTRIC DEVICE BASED ON QUANTUM DOTS AND ITS MANUFACTURING METHOD

CROSS-REFERENCE TO RELATED APPLICATION

This application claims the benefit under 35 U.S.C. § 119 of Korean Patent Application No. 10-2023-0009314 filed on Jan. 25, 2023, in the Korean Intellectual Property Office, the entire disclosure of which is incorporated herein by reference for all purposes.

BACKGROUND

1. Field

The present disclosure relates to a photoelectric device based on quantum dots with an additional zirconium oxide layer, which reduces the persistent photoconductivity (PPC) effect to enable its use as a color selective image sensor, and a manufacturing method thereof.

2. Description of Related Art

With the increasing popularity of next-generation wearables and smart electronic devices, research in this field is actively underway, highlighting the importance of studying photoelectric devices such as photo sensors. A photo sensor is a device that absorbs light of various wavelengths and converts it into an electrical signal. For these photo sensors to be used in next-generation electronic devices, high transparency is required.

Traditionally, most photo sensors have used silicon with small band gaps, but this silicon presents an issue in achieving transparency.

To solve this issue, quantum dots, which are nano particles, have been studied in the past since quantum dots offer a wide range of potential, including easy adjustment of band gaps and the ability to be commercialized as photodetectors through solution processes. Korean Patent Publication No. 10-2021-0130596 describes a photo sensor using quantum dots.

However, while quantum dots have the advantage of providing transparency, they have other issues that make it difficult to ensure their stability in the atmosphere. In other words, while quantum dots offer transparency, they face challenges in ensuring stability in the presence of external oxygen and moisture, making it difficult for devices based on quantum dots to operate stably for long periods of time. Of course, previous studies have tried to employ shells and ligands to the core of the quantum dots in order to protect the core, which is less stable in the atmosphere, but the stability in the atmosphere has not been improved due to the properties of quantum dots in the form of nanoparticles.

In addition, the introduction of ligands into quantum dots has presented another issue: reduced photoreactivity resulting from defects induced by the ligands.

Meanwhile, conventional photoelectric devices based on quantum dots were limited in their use as photoelectric devices due to the persistent photoconductivity (PPC) effect caused by residual photocurrent. As will be seen below, a device with a large PPC effect could not be used as a photoelectric device because the off-state current tends to surpass the on-state current over time when the PPC effect is significant. Therefore, it is necessary to reduce the PPC effect.

SUMMARY

In one general aspect, a photoelectric device based on quantum dots includes: a substrate; a zinc oxide layer stacked on the substrate; a quantum dots (QDs) layer stacked on the zinc oxide layer; and a zirconium oxide layer stacked on the QDs layer. The zirconium oxide layer enables the photoelectric device to serve as a color selective image sensor that selectively detects light in multiple wavelength regions using only quantum dots of a single wavelength.

The zirconium oxide layer may serve as a channel layer and provides a high sensitivity of $6.67 \times 10^5$ and a photoresponsivity of 0.81 A/W.

The zirconium oxide layer, the zinc oxide layer, and the QDs layer may be formed in order of increasing thickness. The QDs layer may be formed to a thickness of 23 nm, the zinc oxide layer to a thickness of 5 nm or less, and the zirconium oxide layer to a thickness of 4 nm or less.

The zirconium oxide layer may be formed by a spin coating process.

The photoelectric device according to the present disclosure may have a slope of 0.017 at a wavelength band of 635 nm, a slope of 0.01 at a wavelength band of 520 nm, and a slope of 0.009 at a wavelength band of 450 nm under a periodic frequency of 1 Hz.

In another aspect, a method for manufacturing a photoelectric device based on quantum dots includes preparing zinc oxide solution and zirconium oxide solution; coating the zinc oxide solution on a substrate to form a zinc oxide layer; coating quantum dots on the zinc oxide layer to form a quantum dots (QDs) layer; forming a zirconium oxide layer on the QDs layer; and forming an electrode on the substrate. The photoelectric device is used as a color selective image sensor.

The zirconium oxide layer may be formed through one coating process and two heat treatment processes. The coating process may be performed at a speed of 3000 rpm for 30 seconds, and the heat treatment process may include primary heat treatment at 120° C. for 1 minute followed by secondary heat treatment at 300° C. for 1 minute.

The preparation of the zinc oxide solution may include dissolving 0.08319 g of zinc oxide powder in 12 ml of ammonium hydroxide to prepare a 0.083 M zinc oxide solution, and stirring the prepared zinc oxide solution for 30 minutes and subsequently storing in a refrigerated environment for 5 hours.

The preparation of the zirconium oxide solution may include dissolving 0.3468 g of zirconium oxynitrate (ZrO$(NO_3)_2 \cdot xH_2O$) in 1 ml of deionized (DI) water, sonicating for 30 minutes, adding 10 ml of ethylene glycol monomethyl ether and stirring for 30 minutes, and adding more ethylene glycol monomethyl ether to dilute to a predetermined ratio.

The zinc oxide layer may be formed by spin-coating the zinc oxide solution at a speed of 3000 rpm for 30 seconds and subsequently performing a heat treatment at 300° C. for 60 minutes.

The QDs layer may be formed by spin-coating 20 mg/ml of CdSe/ZnS-based quantum dots at a speed of 2000 rpm for 30 seconds and subsequently performing a heat treatment at 200° C. for 30 minutes.

The photoelectric device according to the present disclosure may have a slope of 0.017 at a wavelength band of 635 nm, a slope of 0.01 at a wavelength band of 520 nm, and a slope of 0.009 at a wavelength band of 450 nm under a periodic frequency of 1 Hz.

DETAILED DESCRIPTION

Figure 1:
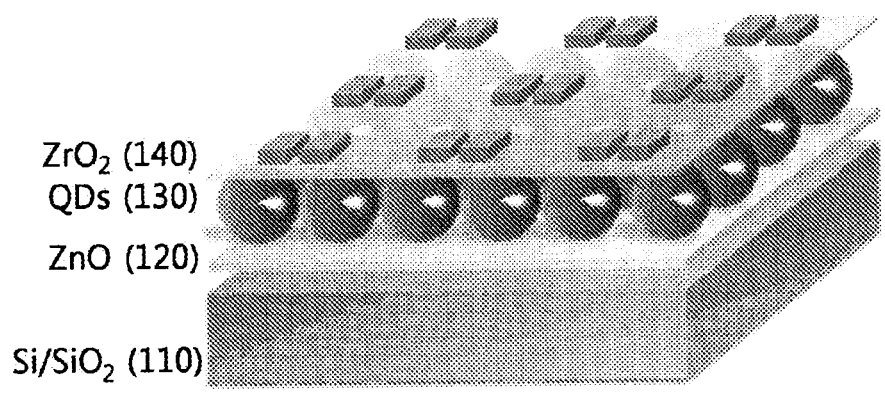
FIG. 1 illustrates a diagram of a photoelectric device based on quantum dots in accordance with an example of the present disclosure.

This invention is capable of various modifications and can have several embodiments, therefore, specific embodiments are illustrated in the drawings and described in detail. However, this is not intended to limit the invention to any particular embodiment, and is to be understood to include all modifications, equivalents or substitutions that fall within the scope of the thought and skill of the present disclosure. In describing the invention, where it is believed that a detailed description of the relevant prior art would obscure the gist of the invention, such detailed description is omitted.

Terms such as first, second, and the like may be used to describe various components, but the components shall not be limited by such terms. These terms are used only for the purpose of distinguishing one component from another.

The terminology used in the present disclosure is intended to describe particular embodiments only and is not intended to limit the invention. Expressions in the singular include the plural unless the context clearly indicates otherwise. In this application, terms such as "includes" or "has" are intended to designate the presence of the features, numbers, steps, actions, components, parts, or combinations thereof described in the specification, not the presence of one or more other features, numbers, steps, actions, components, or combinations thereof.

The spatially relative terms below, beneath, lower, above, upper, and the like may be used to facilitate the description of the relationship of one element or component to another element or component as shown in the drawings. Spatially relative terms should be understood to include different orientations of an element in use or operation in addition to the orientations shown in the drawings. For example, an element described as being below or beneath another element may be placed above or above another element when the elements shown in the drawing are inverted. Thus, the exemplary term below may include both below and above orientations. Elements may also be orientated in other directions, and accordingly, spatially relative terms may be interpreted according to their orientation.

Accordingly, the idea of the invention is not to be limited to the embodiments described, and it will be understood that the following patent claims, as well as all equivalents or equivalent variations thereof, fall within the scope of the idea of the invention.

The object of the present disclosure is to solve the above problems. The present disclosure provides a photoelectric device based on quantum dots which can operate stably for a long period of time and can prevent defects caused by ligands, and a manufacturing method thereof.

Another object of the present disclosure is to provide a photoelectric device based on quantum dots that reduces the persistent photoconductivity (PPC) effect of the photoelectric device so that it can be used as a color selective image sensor, and a manufacturing method thereof.

Another object of the present disclosure is to provide a photoelectric device based on quantum dots that can selectively detect light in multiple wavelength regions using only quantum dots of a single wavelength, by enabling a zirconium oxide layer formed on top of the quantum dots to function as a charge transport layer and protecting the surface of the quantum dots, and a manufacturing method thereof.

The technical challenges of the present disclosure are not limited to the technical challenges mentioned above, and other technical challenges not mentioned will be apparent to those skilled in the art from the following description.

In the following, the invention will be described in more detail with reference to the embodiments shown in the drawings.

A photoelectric device 100 according to an example of the present disclosure may be a photodetector, such as a photodiode, photoresistor, phototransistor, etc. A phototransistor is a device that can control a wide range of photo currents by adjusting the gate voltage and the drain voltage.

The photoelectric device 100 based on quantum dots according to an example of the present disclosure is characterized by being formed through the sequential stacking of zirconium oxide ($ZrO_2$) onto zinc oxide (ZnO)/quantum dots (QDs) treated with a solution. Through the zirconium oxide, quantum dots can be protected and stability can be achieved. Additionally, by incorporating zirconium oxide ($ZrO_2$) as a channel layer, the photoelectric device can achieve a high photosensitivity of $6.67 \times 10^5$ and a photoresponsivity of 0.81 A/W.

The photoelectric device based on quantum dots with these technical features will be discussed in detail.

FIG. 1 illustrates a diagram of a photoelectric device based on quantum dots in accordance with an example of the present disclosure.

Referring to FIG. 1, a photoelectric device 100 based on quantum dots according to the present disclosure includes a substrate 110, a zinc oxide layer 120, a layer of quantum dots (QDs) (hereinafter referred to as "QDs layer") 130, and a zirconium oxide ($ZrO_2$) layer 140.

The substrate 110 may have a structure with a gate terminal formed at the bottom and a thin-film transistor (TFT) formed at the top. The substrate 110 may be formed of materials such as silicon (Si) or silicon oxide ($SiO_2$). However, in addition to these materials, various other materials may be adopted for constructing the photoelectric device.

The substrate 110 features a structure where zinc oxide (ZnO) 120/quantum dots (QDs) 130/zirconium oxide (ZrO$_2$) 140 are stacked on top of the substrate 110. In an example, the thickness of the zinc oxide (ZnO) layer 120 and the QDs layer 130 may be formed to be 5 nm or less and 23 nm, respectively. In addition, the zirconium oxide layer 140 deposited on top of the QDs layer 130 may be formed by deposition to a thickness of about 4 nm or less, for example, via a spin coating process. Since zirconium oxide can be formed on top of the QDs layer 130 with a predetermined thickness through a solution process, manufacturing time and costs can be reduced compared to general methods such as vacuum deposition, atomic layer deposition, and sputtering.

The surface roughness was reduced by the formation of zirconium oxide (ZrO$_2$) 140 stacked on top of the QDs layer 130. In other words, through experimentation, it was observed that the surface roughness of quantum dots was decreased from 3.32 nm for the original quantum dots to 2.72 nm with the formation of zirconium oxide (ZrO$_2$). Consequently, an improvement in electrical characteristics was achieved. In embodiments, roughness can be confirmed using Atomic Force Microscopy (AFM) measurement images.

Specifically, it was confirmed that the photoelectric device with the conventional structure of zinc oxide (ZnO) 120/quantum dots (QDs) 130 experienced degradation in electrical characteristics due to its high surface roughness, whereas the photoelectric device with the structure of zinc oxide (ZnO) 120/quantum dots (QDs) 130/zirconium oxide (ZrO$_2$) 140, incorporating ZrO$_2$, exhibited improved electrical characteristics. This improvement could be attributed to the reduction in surface roughness.

The root mean square values of the surface roughness of the photoelectric device with the following structures: zinc oxide (ZnO); zinc oxide (ZnO) 120/quantum dots (QDs) 130; and zinc oxide (ZnO) 120/quantum dots (QDs) 130/zirconium oxide (ZrO$_2$) 140, were determined using the AFM measurement images as described above. The addition of ZrO$_2$ resulted in a decrease in surface roughness from 3.32 to 2.72 nm, contributing the enhanced electrical characteristics.

Figure 2:
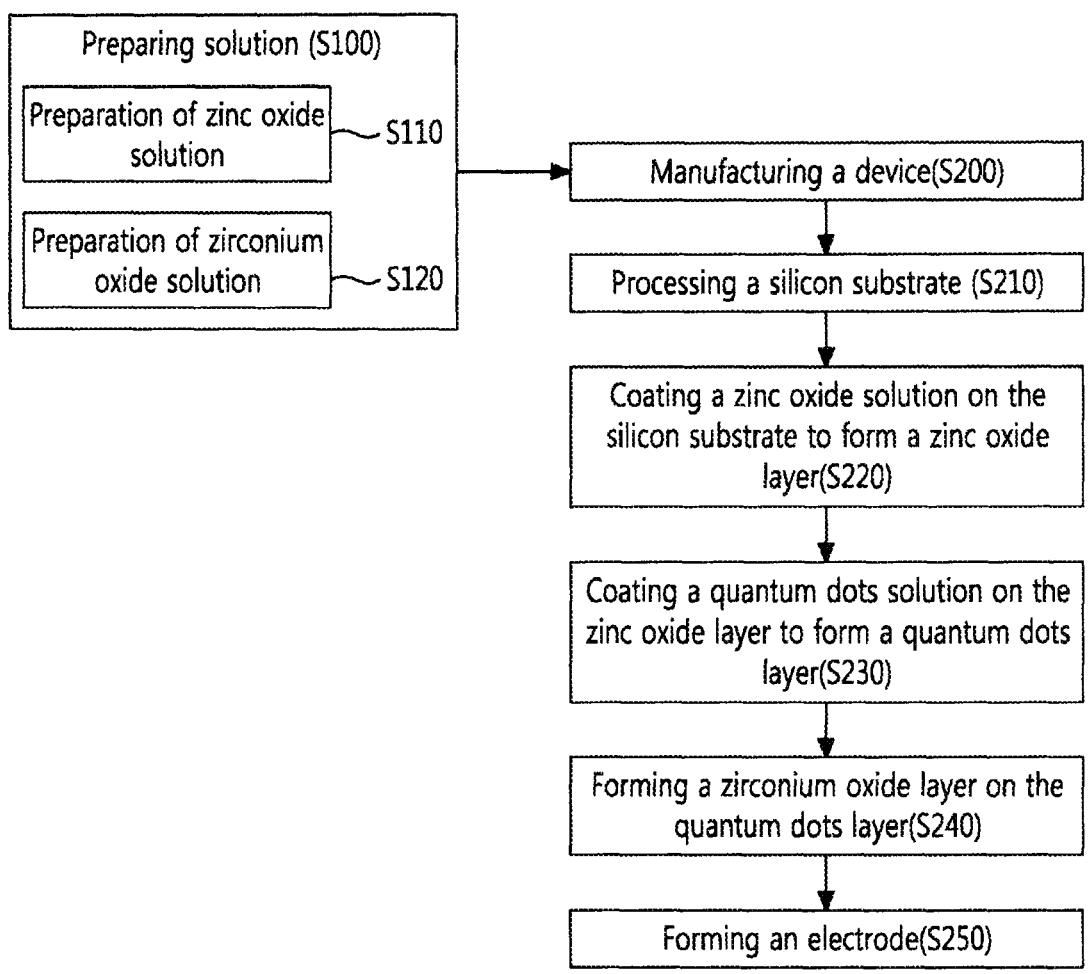
FIG. 2 illustrates a process flowchart of the manufacturing process of another photoelectric device based on quantum dots in accordance with an example of the present disclosure.

FIG. 2 illustrates a process flowchart of the manufacturing process of another photoelectric device based on quantum dots in accordance with an embodiment of the present disclosure.

The manufacturing process in accordance with embodiments of the present disclosure can be broadly categorized into solution preparation S100 and device manufacturing S200.

Solution Preparation (S100)

In solution preparation, solutions of zinc oxide (ZnO) and zirconium oxide (ZrO$_2$) can be prepared.

Firstly, it is the process of preparing zinc oxide (ZnO) solution (S110).

12 ml of ammonium hydroxide is dissolved with 0.08319 g of zinc oxide (ZnO) powder to prepare a 0.083 M zinc oxide solution. After stirring the prepared zinc oxide solution for 30 minutes, it is stored in a refrigerated environment for 5 hours to increase solubility.

Secondly, it is the process of preparing zirconium oxide (ZrO$_2$) solution (S120).

0.3468 g of zirconium oxynitrate (ZrO(NO$_3$)$_2$·xH$_2$O) is dissolved in 1 ml of deionized (DI) water, followed by sonication for 30 minutes. This process results in the preparation of a uniform and transparent solution.

After sonication, 10 ml of ethylene glycol monomethyl ether is added and stirred for 30 minutes. Subsequently, additional ethylene glycol monomethyl ether is added to the solution to dilute the solution to concentrations of 0.01 M, 0.03 M, 0.05 M and 0.1 M. The purpose for diluting zirconium oxide (ZrO$_2$) to concentrations of 0.01 M, 0.03 M, 0.05 M, and 0.1 M is to compare the properties of the zirconium oxide (ZrO$_2$) at different concentrations.

Device Manufacturing (S200)

The silicon substrate to be used in various devices, such as photoelectric devices, may be a boron-doped substrate with a silicon dioxide (SiO$_2$) layer of 100 nm thickness, which may be used as a gate electrode and a gate dielectric.

The silicon substrate is sonicated in deionized (DI) water, acetone, and 2-propanol (IPA) for 15 minutes each. Subsequently, nitrogen gas is blown onto the silicon substrate, followed by treatment with UV ozone for 15 minutes to remove any residual organic impurities remaining on the silicon substrate, resulting in a hydrophilic surface (S210).

Then, the zinc oxide (ZnO) solution prepared in the aforementioned solution preparation process is spin-coated onto the silicon substrate at a speed of 3000 rpm for 30 seconds, followed by heat treatment at 300° C. for 60 minutes to form a zinc oxide layer (ZnO layer) (S220).

Then, quantum dots based on CdSe/ZnS (20 mg/ml, Uniam) are spin-coated on the ZnO layer at 2000 rpm for 30 seconds, followed by heat treatment at 200° C. for 30 minutes to form a quantum dots layer (QDs layer) (S230).

The ZnO layer and the QDs layer are sequentially formed, and then the ZrO$_2$ layer is formed on the QDs layer. The ZrO$_2$ layer is formed by spin coating the ZrO$_2$ solution prepared in the aforementioned solution preparation process onto the QDs layer at a speed of 3000 rpm for 30 seconds, followed by primary heat treatment at 120° C. for 1 minute and secondary heat treatment at 300° C. for 1 minute (S240).

In this way, by forming a ZrO$_2$ layer on top of quantum dots, which are nanoparticles, it is possible to protect the quantum dots from the external atmosphere and also solve the issue of reduced photoreactivity caused by the ligands that traditionally applied to protect the core of the quantum dots.

Finally, electrodes are formed (S250). In embodiments, the formation of electrodes involves creating source and drain electrodes with a thickness of 100 nm using a metal shadow mask with channel lengths and widths of 100 μm and 1000 μm, respectively. Source and drain electrodes may be formed by thermal evaporation at a ratio of 3 A/S under a pressure of $5 \times 10^{-6}$ torr.

In the following, the characteristics of the photoelectric device based on quantum dots according to the present disclosure will be discussed.

Figure 3:
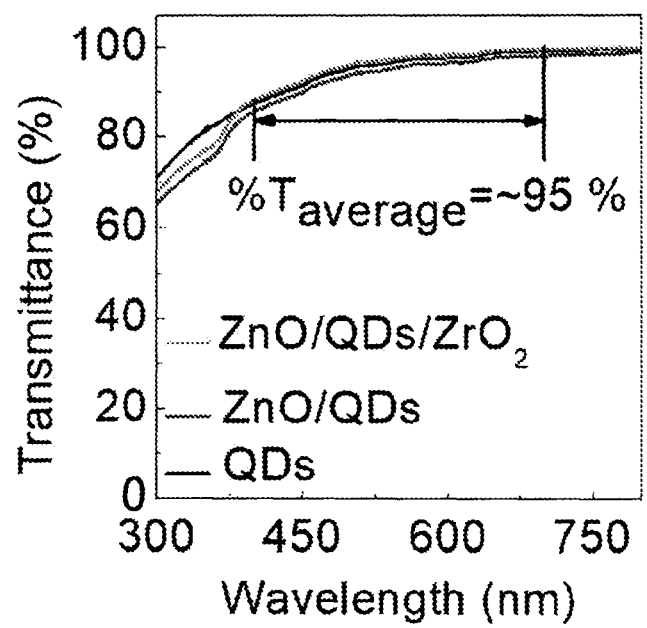
FIG. 3 illustrates a diagram that compares the photo transmittance between a conventional photoelectric device and the photoelectric device of the present disclosure.

FIG. 3 illustrates a diagram comparing the photo transmittance between a conventional photoelectric device and the photoelectric device of the present disclosure.

It can be seen that the structure with stacked zirconium oxide (ZrO$_2$) in the present disclosure (ZnO/QDs/ZrO$_2$) exhibits higher photo transmittance compared to the structures without zirconium oxide (i.e., QDs or ZnO/QDs). The structure of ZnO/QDs/ZrO$_2$ exhibits a high transmittance of over 95% in the visible light region. Photoelectric devices require high transparency in the visible light range, and being able to provide over 95% transmittance may mean that it is sufficient for functioning as a photoelectric device.

Figure 4:
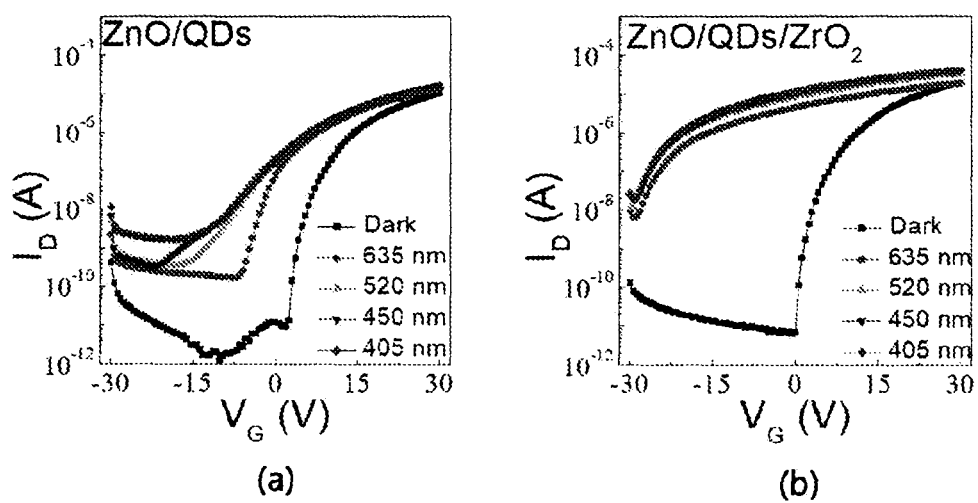
FIG. 4 illustrates a diagram showing a transfer curve between a conventional photoelectric device and the photoelectric device of the present disclosure.

FIG. 4 illustrates a diagram showing a transfer curve between a conventional photoelectric device and the photoelectric device according to the present disclosure. The transfer curve is a graph measured under light illumination conditions with a power density of ~4.5 mW/cm². Comparing the photoelectric device of the conventional structure of ZnO/QDs of the photoelectric device with the structure of ZnO/QDs/ZrO₂ of the photoelectric device according to the present disclosure, it can be seen that the structure of the present disclosure exhibits improved photoresponse characteristics at a wavelength of 635 nm.

Figure 5:
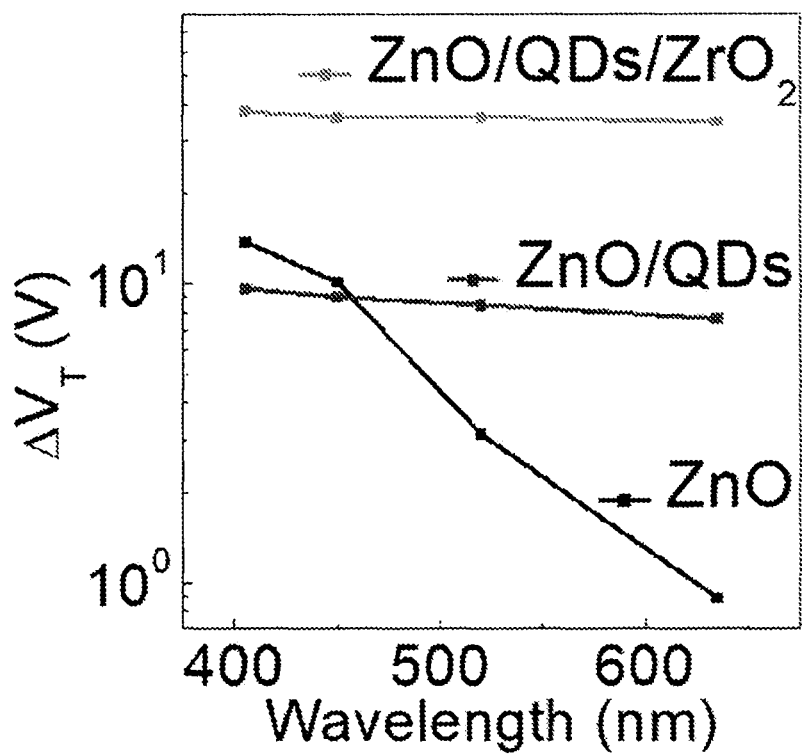
FIG. 5 illustrates a graph that compares the $V_T$ shift values between a conventional photoelectric device and the photoelectric device of the present disclosure.

FIG. 5 illustrates a graph comparing the $V_T$ shift values between a conventional photoelectric device and the photoelectric device according to the present disclosure. Referring to the graph, it can be seen that in the 635 nm wavelength range, the photoelectric device with the ZnO structure exhibits 1.29 V, the photoelectric device with the ZnO/QDs structure exhibits 7.48 V, while the photoelectric device with the ZnO/QDs/ZrO₂ structure exhibits 37.07 V, indicating the highest amount of photocurrent generation.

Figure 6:
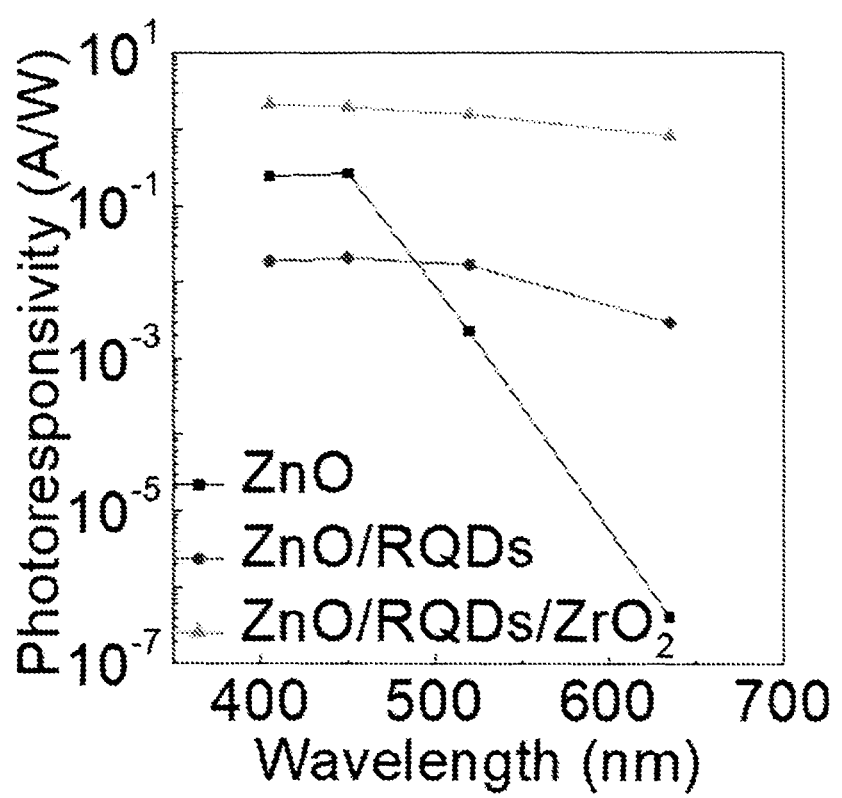
FIG. 6 illustrates a graph showing the photoresponsivity between a conventional photoelectric device and the photoelectric device of the present disclosure.

FIG. 6 illustrates a graph showing the photoresponsivity between a conventional photoelectric device and the photoelectric device according to the present disclosure.

Referring to FIG. 6, the photoresponsivity of photoelectric devices with the structures of ZnO, ZnO/QDs, and ZnO/QDs/ZrO₂ at wavelengths of 635 nm, 520 nm, 450 nm, and 405 nm under a power density of 4.5 mW/cm² is calculated using Equation 1.

$$\text{Photoresponsivity} = \frac{(I_{light} - I_{dark})/A_{pt}}{P/A_{pd}} = \frac{J_{ph}}{p} \quad \text{Equation 1}$$

where light is the current under light illumination, $I_{dark}$ is the current under dark conditions, $A_{pt}$ is the product of channel width and thickness, P is the incident light power density, $A_{pd}$ is the spot size of the laser source, $J_{ph}$ is the photocurrent density, and $V_G$ is set to −3 V.

According to the calculation results obtained from Equation 1, the photoresponsivity of the photoelectric device with a ZnO structure is negligible at the 635 nm wavelength range, but it begins to increase at the 520 nm wavelength range. The photoelectric device with a ZnO/QDs structure exhibits a reliable photoresponsivity of 0.003 A/W at the 635 nm wavelength range. In contrast, the photoelectric device with the ZnO/QDs/ZrO₂ structure according to the present disclosure is calculated to have a photoresponsivity of 0.81 A/W at the 635 nm wavelength range. It can be confirmed that the structure according to the present disclosure exhibits a higher photoresponsivity compared to the conventional structure.

Figure 7:
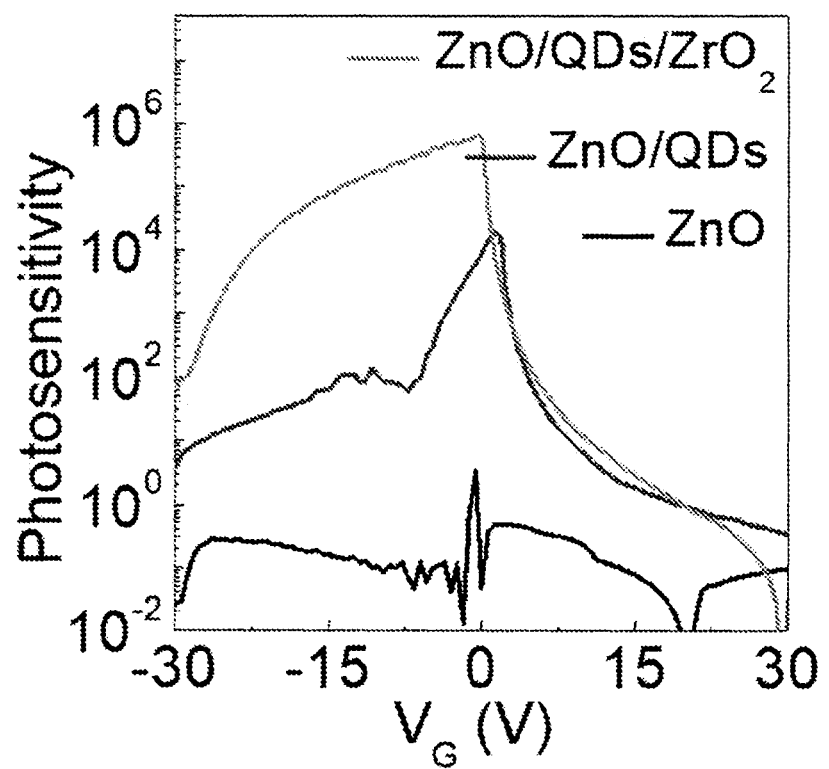
FIG. 7 illustrates a graph showing the photosensitivity between a conventional photoelectric device and the photoelectric device of the present disclosure.

FIG. 7 illustrates a graph showing the photosensitivity between a conventional photoelectric device and the photoelectric device according to the present disclosure.

The photosensitivity serves as an indicator representing the ratio of photocurrent to dark current. The photosensitivity of photoelectric devices with structures of ZnO, ZnO/QDs, and ZnO/QDs/ZrO₂ at the 635 nm wavelength range was calculated using Equation 2.

$$\text{Photosensitivity} = (I_{photo} - I_{dark})/I_{dark} \quad \text{Equation 2}$$

where $I_{photo}$ and $I_{dark}$ indicate the current with and without light illumination, respectively.

According to the calculation results obtained from Equation 2, the photosensitivity of the photoelectric device with a ZnO structure exhibits almost negligible levels, while the photoelectric device with a ZnO/QDs/ZrO₂ structure exhibited a significantly high photoresponsivity of 6.67×10⁵.

The following Table 1 shows the $V_T$ shift values, photoresponsivity, and photosensitivity for each respective structure.

TABLE 1

| Structure | $V_T$ shift [V] | Photoresponsivity [A/W] | Photosensitivity |
|---|---|---|---|
| ZnO | 0.89 | $4.2 \times 10^{-7}$ | 3.4 |
| ZnO/QDs | 7.65 | 0.003 | $1.97 \times 10^4$ |
| ZnO/QDs/ZrO₂ | 34.85 | 0.81 | $6.67 \times 10^5$ |

Figure 8:
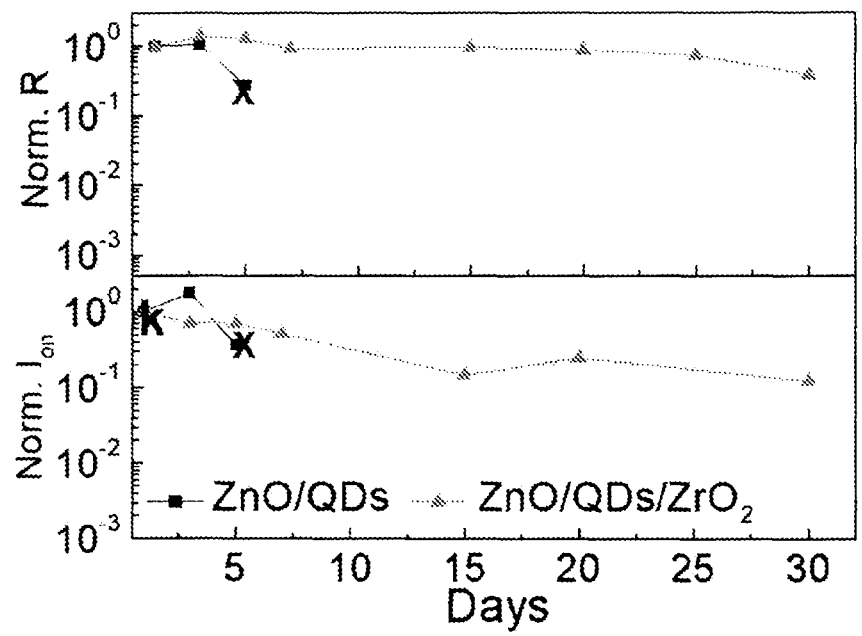
FIG. 8 illustrates a graph of the stability between a conventional photoelectric device and the photoelectric device of the present disclosure.

FIG. 8 illustrates a graph showing the stability between a conventional photoelectric device and the photoelectric device according to the present disclosure. Stability is an indicator used to assess whether electrical characteristics and photoresponse characteristics persist even after a predetermined time period.

Experiment of FIG. 8 was conducted under conditions of 40% or less relative humidity to test durability. From this, it can be seen that the conventional photoelectric device with a ZnO/QDs structure, lacking the ZrO₂ layer, exhibited electrical and photoresponse characteristics for about 5 days, whereas the photoelectric device with the ZnO/QDs/ZrO₂ structure according to the present disclosure sustained electrical and photoresponse characteristics for up to about 30 days. This demonstrates its stability over a longer period of time.

Meanwhile, Table 2 compares the electrical characteristics of the conventional structures with those of the structure according to the present disclosure.

TABLE 2

| structure | µsat [cm²/V · s] | $I_{on}/I_{off}$ | S/S [V/decade] | VT [V] |
|---|---|---|---|---|
| ZnO | 0.27 | $2.67 \times 10^6$ | 0.095 | 5.96 |
| ZnO/QDs | 0.13 | $8.11 \times 10^5$ | 0.196 | 7.4 |
| ZnO/QDs/ZrO₂(0.01M) | 0.19 | $2.06 \times 10^4$ | 0.432 | 5.56 |
| ZnO/QDs/ZrO₂(0.03M) | 0.20 | $2.73 \times 10^6$ | 0.091 | 6.05 |
| ZnO/QDs/ZrO₂(0.05M) | 0.04 | $3.97 \times 10^5$ | 0.200 | 6.42 |
| ZnO/QDs/ZrO₂(0.1M) | — | — | — | — |

Figure 9:
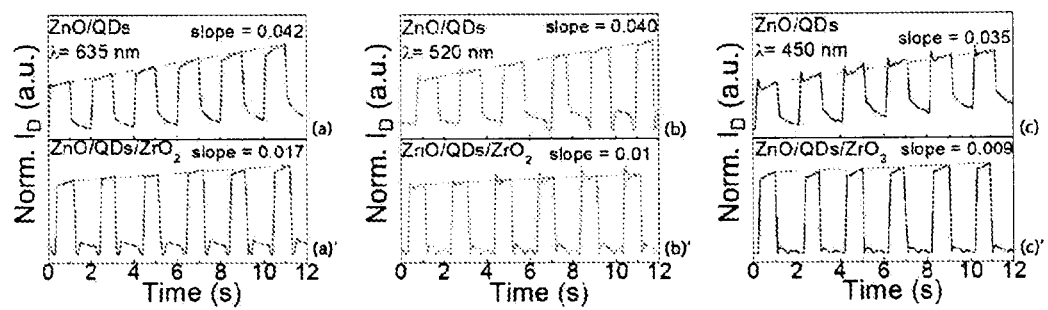
FIG. 9 illustrates a graph explaining PPC effect between a conventional photoelectric device and the photoelectric device of the present disclosure.

FIG. 9 illustrates a graph explaining PPC effect between a conventional photoelectric device and the photoelectric device of the present disclosure. (a) to (c) of FIG. 9 are graphs illustrating the photo response characteristics of a conventional photoelectric device, and (a') to (c') of FIG. 9 are graphs illustrating the photo response characteristics of the photoelectric device of the present disclosure.

As described earlier, one important aspect for the properly performing the function of a photoelectric device is a low PPC effect. When the operation of applying and blocking light of a predetermined wavelength band for a predetermined time is repeatedly performed, a device with a large PPC effect cannot function as a photoelectric device. Therefore, it is important to reduce the PPC effect.

According to embodiments, the PPC effect was confirmed by analyzing transient photocurrent. The excessive characteristics were measured by irradiating visible light at a power density of 4.5 mW/cm² and a frequency of 1 Hz.

Referring to FIG. 9, it can be seen that when light with wavelengths of 635 nm, 520 nm, 450 nm is irradiated, the photoelectric device with ZnO/QDs structure and the photoelectric device with ZnO/QDs/ZrO₂ exhibit different photo response characteristics.

Specifically, the rate of increase in transient current was measured, and this rate of increase can be obtained from the slope by connecting the maximum points of each peak. It can be seen that under a periodic incident wavelength of 1 Hz with a wavelength band of 635 nm, the slope of the conventional photoelectric device (a) decreased to 0.042 and the slope of the photoelectric device according to the present disclosure (a') decreased to 0.017. Similarly, it can be seen that the slopes (b, b') at the wavelength band of 520 nm and slopes (c, c') at the wavelength band of 450 nm are reduced from 0.04 to 0.01 and from 0.035 to 0.009, respectively. Thus, the ZnO/QDs/ZrO$_2$ structure with added ZrO$_2$ provides more reduced PPC effect than the ZnO/QDs structure. This can be attributed to the decreased surface roughness of the QDs due to the added ZrO$_2$, which resulted in more photocurrent being generated.

As described above, the photoelectric device is designed by stacking a solution-produced ZrO$_2$ layer on the ZnO/QDs layer. The ZrO$_2$ layer functions as a channel layer, protects the quantum dots from the atmosphere, and ensures long-term stable operation. It can also be seen that the present disclosure improves the photo response characteristics and reduces the PPC effect due to the reduction of defects in the quantum dots, making it a promising candidate for next-generation photoelectric devices.

Moreover, the photoelectric device according to the present disclosure can be utilized in various technical fields. For example, it can be widely applied to transparent electronic devices, optical sensors for smart glasses, transparent electronic devices for full-color CCDs, transparent sensors for smart windows, vehicles, and wearable electronic devices, etc., so the industrial availability is very high.

According to the present disclosure, a photoelectric device where zirconium oxide is formed on top of quantum dots through a solution process is proposed. As a result, it ensures high stability in the atmosphere and offers the advantage of securing excellent photoresponse by resolving the conventional defects caused by ligands when ligands were applied to quantum dots for stability in the atmosphere. Thus, the zirconium oxide layer formed on top of the quantum dots can protect the surface of the quantum dots along with the function of the charge transport layer, which has the effect of selectively detecting light in multiple wavelength regions using only quantum dots of a single wavelength.

As described above, the present disclosure is described with reference to the illustrated embodiments, but these are merely illustrative examples, and those of ordinary skill in the art to which the present disclosure pertains can make various modifications without departing from the gist and scope of the present disclosure. It will be apparent that variations, modifications, and equivalent other embodiments are possible. Therefore, the true scope of technical protection of the present disclosure should be determined by the technical sprit of the appended claims.

What is claimed is:

1. A method for manufacturing a photoelectric device based on quantum dots, comprising:
    preparing zinc oxide solution and zirconium oxide solution;
    coating the zinc oxide solution on a substrate to form a zinc oxide layer;
    coating quantum dots on the zinc oxide layer to form a quantum dots (QDs) layer;
    forming a zirconium oxide layer on the QDs layer; and
    forming an electrode on the substrate,
    wherein the photoelectric device is used as a color selective image sensor,
    wherein the zirconium oxide layer is formed through one coating process and two heat treatment processes,
    wherein the one coating process is performed at a speed of 3000 rpm for 30 seconds, and the two heat treatment processes include primary heat treatment at 120° C. for 1 minute followed by secondary heat treatment at 300° C. for 1 minute.

2. The method of claim 1,
    wherein the preparation of the zinc oxide solution comprises dissolving 0.08319 g of zinc oxide powder in 12 ml of ammonium hydroxide to prepare a 0.083 M zinc oxide solution, and stirring the prepared zinc oxide solution for 30 minutes and subsequently storing in a refrigerated environment for 5 hours.

3. The method of claim 1,
    wherein the preparation of the zirconium oxide solution comprises dissolving 0.3468 g of zirconium oxynitrate (ZrO(NO$_3$)$_2$·xH$_2$O) in 1 ml of deionized (DI) water, sonicating for 30 minutes, adding 10 ml of ethylene glycol monomethyl ether and stirring for 30 minutes, and adding more ethylene glycol monomethyl ether to dilute to a predetermined ratio.

4. The method of claim 1,
    wherein the zinc oxide layer is formed by spin-coating the zinc oxide solution at a speed of 3000 rpm for 30 seconds and subsequently performing a heat treatment at 300° C. for 60 minutes.

5. The method of claim 1,
    wherein the QDs layer is formed by spin-coating 20 mg/ml of CdSe/ZnS-based quantum dots at a speed of 2000 rpm for 30 seconds and subsequently performing a heat treatment at 200° C. for 30 minutes.

6. The method of claim 1,
    wherein the photoelectric device has a slope of 0.017 at a wavelength band of 635 nm, a slope of 0.01 at a wavelength band of 520 nm, and a slope of 0.009 at a wavelength band of 450 nm under a periodic frequency of 1 Hz.

* * * * *